US008445770B2

(12) United States Patent
Jacob

(10) Patent No.: US 8,445,770 B2
(45) Date of Patent: May 21, 2013

(54) PROGRAMABLE SWITCH FOR CONFIGURING CIRCUIT TOPOLOGIES

(76) Inventor: Bruce Ledley Jacob, Laurel, MD (US)

( * ) Notice: Subject to any disclaimer, the term of this patent is extended or adjusted under 35 U.S.C. 154(b) by 1175 days.

(21) Appl. No.: 12/234,682

(22) Filed: Sep. 21, 2008

(65) Prior Publication Data

US 2009/0308233 A1 Dec. 17, 2009

Related U.S. Application Data

(60) Provisional application No. 61/061,601, filed on Jun. 14, 2008.

(51) Int. Cl.
*G10H 3/12* (2006.01)
*G10H 1/02* (2006.01)
*H03K 19/173* (2006.01)

(52) U.S. Cl.
USPC .................... 84/742; 84/735; 84/737; 326/38

(58) Field of Classification Search
USPC ........ 84/735, 737, 742, 743, 726; 326/37–41, 326/47
See application file for complete search history.

(56) References Cited

U.S. PATENT DOCUMENTS

| | | | | |
|---|---|---|---|---|
| 4,151,776 | A | 5/1979 | Stich | |
| 5,136,918 | A | 8/1992 | Riboloff | |
| 5,763,808 | A | 6/1998 | Thomson | |
| 5,780,760 | A | 7/1998 | Riboloff | |
| 5,866,834 | A * | 2/1999 | Burke et al. | 84/622 |
| 5,898,121 | A | 4/1999 | Riboloff | |
| 6,121,537 | A | 9/2000 | Pawar | |
| 6,253,654 | B1 | 7/2001 | Mercurio | |
| 6,271,456 | B1 * | 8/2001 | Nelson | 84/726 |
| 6,316,713 | B1 * | 11/2001 | Furst et al. | 84/726 |
| 6,762,618 | B1 * | 7/2004 | Zhu | 326/16 |
| 6,781,050 | B2 | 8/2004 | Olvera | |
| 6,998,529 | B2 * | 2/2006 | Wnorowski | 84/726 |
| 7,115,810 | B2 * | 10/2006 | Ambrosino | 84/742 |
| 7,208,673 | B2 * | 4/2007 | Bryce | 84/742 |
| 2003/0145715 | A1 | 8/2003 | Wnorowski | |
| 2004/0003703 | A1 * | 1/2004 | Chapman et al. | 84/453 |
| 2005/0150364 | A1 | 7/2005 | Krozack | |
| 2005/0211081 | A1 * | 9/2005 | Bro et al. | 84/737 |
| 2006/0011051 | A1 * | 1/2006 | Aivbrosino | 84/742 |
| 2010/0275760 | A1 * | 11/2010 | Gain et al. | 84/615 |

OTHER PUBLICATIONS

ToneShaper for Stratocaster Acme Guitar Works www.toneshapers.com/Tone-Shapers-Manuals-Wiring-Diagrams-W8C318aspx#sw5a.

Tom Anderson's Switcheroo www.andersonguitars.com/support/switcheroo.cfm.

Fender S1 switching system supportfender.com/diagrams/stratocaster/0101500_02A/SD0101500_02APg2.pdf.

* cited by examiner

*Primary Examiner* — Shawki Ismail
*Assistant Examiner* — Dylan White

(57) ABSTRACT

The disclosed invention is a programmable switch for configuring circuit topologies. The switch can be any type of mechanical or electronic switch. Every setting of the switch can be programmed by a user, selecting topologies such as circuit elements in series, in parallel, in phase or out of phase. In a dual switch embodiment, the first switch selects the circuit elements to be used, and the second switch configures those selected elements in a wide variety of topologies. This division in switch circuit design between element selection and then topology provides an extremely wide range of circuit topologies available, unlike prior art designs.

21 Claims, 22 Drawing Sheets

(prior art: ganged switch operation/notation)

(a) The three settings of the DPDT on-on-on switch (b) The DPDT on-on-on switch wired 22 to produce circuit elements A and B in series (24, switch setting 1), element A singly (26, switch setting 2), and element A in parallel with element B (28, switch setting 3)

(prior art: on-on-on DPDT switch operation)

```
//
// Pseudo-VerilogAMS example (illustrative pseudocode)
//

// MACROS

// no voltage difference between a & b (short circuit)
'define connect(a,b) V(a,b) <+ 0

// no current flows between a & b (open circuit)
'define disconnect(a,b) I(a,b) <+ 0
```

Figure 4(a) (program listing)

```
//
// Pseudo-VerilogAMS example (illustrative pseudocode)
//

// onOff_switch - single bit of program bank
// state of switchstate bit determines switch open/closed
//
module onOff_switch ( switchstate, common, lead );
    input switchstate;
    inout common, lead;

    analog begin if (switchstate == 1'b1)
        connect(common,lead); // switch closed
    else
        disconnect(common,lead); // switch open
    end
endmodule
```

Figure 4(b) (program listing)

```
//
// Pseudo-VerilogAMS example (illustrative pseudocode)
//

// a single Program Bank of 6 prog bits collected together
//
module programBank6 ( switchstate, leftside, rightside );
    input [5:0] switchstate;
    inout [5:0] leftside, rightside;

    onOff_switch prog0 ( switchstate[0], leftside[0], rightside[0] );
    onOff_switch prog1 ( switchstate[1], leftside[1], rightside[1] );
    onOff_switch prog2 ( switchstate[2], leftside[2], rightside[2] );
    onOff_switch prog3 ( switchstate[3], leftside[3], rightside[3] );
    onOff_switch prog4 ( switchstate[4], leftside[4], rightside[4] );
    onOff_switch prog5 ( switchstate[5], leftside[5], rightside[5] );
endmodule
```

Figure 4(c) (program listing)

```
//
// Pseudo-VerilogAMS example (illustrative pseudocode)
//

// 1-pole three-way switch
// state of sw3_state determines common lead
// connected to which input lead
//
module 1p3t_switch ( sw3_state, common, lead1, lead2, lead3 );
    integer sw3_state;
    inout common, lead1, lead2, lead3;

    analog begin if (sw3_state == 1'b1) begin
        connect (common, lead1);
        disconnect (common, lead2);
        disconnect (common, lead3);
    end else if (sw3_state == 1'b2) begin
        disconnect (common, lead1);
        connect (common, lead2);
        disconnect (common, lead3);
    end else begin
        disconnect (common, lead1);
        disconnect (common, lead2);
        connect (common, lead3);
    end end
endmodule
```

Figure 4(d) (program listing)

```
//
// Pseudo-VerilogAMS example (illustrative pseudocode)
//

// 4-pole three-way switch
// (four 1p3t_switch modules ganged together by a common switch state)
//
module 4p3t_switch ( sw3_state, common, leads1, leads2, leads3 );
    integer sw3_state;
    inout [3:0] common, leads1, leads2, leads3;

    1p3t_switch sw0 ( sw3_state, common[0], leads1[0], leads2[0], leads3[0] );
    1p3t_switch sw1 ( sw3_state, common[1], leads1[1], leads2[1], leads3[1] );
    1p3t_switch sw2 ( sw3_state, common[2], leads1[2], leads2[2], leads3[2] );
    1p3t_switch sw3 ( sw3_state, common[3], leads1[3], leads2[3], leads3[3] );
endmodule
```

Figure 4(d) (program listing)

```
//
// Pseudo-VerilogAMS example (illustrative pseudocode)
//

// a programmable 4p3t switch implementing the following settings,
// assuming there are two different circuit elements (e.g.,
// capacitors, inductors, resistors, etc.) wired to its 4 poles:
//   switch position 1: elements wired in series, in phase
//                      or wired in series, out of phase
//   switch position 2: elements wired in parallel
//   switch position 3: single element (poles 1 & 2)
//                      or both in series, out of phase
//
moduleprog_3way_switch ( sw3_state, pb_state, ports, signal, ground );
    integer sw3_state;
    input [5:0] pb_state;
    inout [3:0] ports;
    inout signal, ground;

    electrical [3:0] leads1, leads2, leads3;
    electrical [5:0] leftside, rightside;

    4p3t_switch switch ( sw3_state, ports, leads1, leads2, leads3 );
    programBank6 pb ( pb_state, leftside, rightside );

    analog begin
        connect(leads1[0], leftside[0]);
        connect(leads1[0], leftside[2]);
        connect(leads1[1], leftside[1]);
        connect(leads1[1], leftside[3]);
        connect(leads1[2], rightside[2]);
        connect(leads1[2], rightside[3]);
        connect(leads1[3], ground);

        connect(leads2[0], signal);
        connect(leads2[1], ground);
        connect(leads2[2], signal);
        connect(leads2[3], ground);

        connect(leads3[0], signal);
        connect(leads3[1], leftside[4]);
        connect(leads3[1], leftside[5]);
        connect(leads3[2], ground);
        connect(leads3[3], rightside[5]);

        connect(rightside[0], signal);
        connect(rightside[1], signal);
        connect(rightside[4], ground);
    end
endmodule
```

Figure 4(f) (program listing)

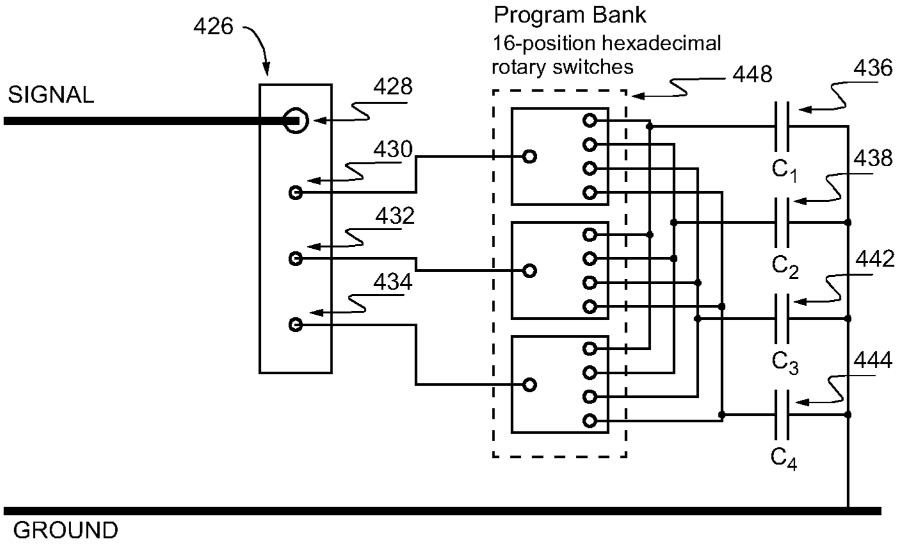
16-position hexadecimal rotary switch behavior
(prior art)
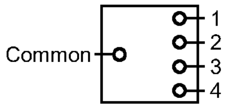
| | | Switch setting | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | A | B | C | D | E | F |
| Common connects to | 1 | | ● | | ● | | ● | | ● | | ● | | ● | | ● | | ● |
| | 2 | | | ● | ● | | | ● | ● | | | ● | ● | | | ● | ● |
| | 3 | | | | | ● | ● | ● | ● | | | | | ● | ● | ● | ● |
| | 4 | | | | | | | | | ● | ● | ● | ● | ● | ● | ● | ● |
Figure 15

PROGRAMABLE SWITCH FOR CONFIGURING CIRCUIT TOPOLOGIES

CROSS-REFERENCE TO RELATED APPLICATION

This application claims the benefit of U.S. Provisional Application No. 61/061,601, filed Jun. 14, 2008.

BACKGROUND OF THE INVENTION

This invention relates to a programmable switch for use in several application domains, such as signal processing and musical instruments having electronic pickups, for example electromagnetic, piezoelectric, or microphonic. Specifically, the embodiments disclose a programmable switch that can produce a wide range of circuit topologies with a minimum number of controls.

Signal processing applications frequently make use of filters built from combinations of circuit elements such as capacitors, resistors, and inductors. Different circuit topologies and different values of capacitance, resistance, and inductance tune the filters to different frequency ranges, and so it is valuable to have a switch that can select different circuit elements and then configure those selected elements in different ways, thereby dynamically producing different filters.

Similarly, a musical instrument that has an electronic pickup system produces dramatically different sounds depending on the pickup topology of the musical instrument. For example, in an electric guitar, a pickup topology is the use of the pickups in series, in parallel, in phase or out of phase, and different combinations of pickups, depending on the number of pickups in the guitar.

A design in the prior art that is used to achieve multiple circuit topologies, for example multiple pickup topologies on the same guitar, is a ganged, multi-pole switch. Ganged switches behave like multiple independent switches tied together. For example, two switches are illustrated in FIG. 1: a DPDT (dual-pole, dual-throw) switch 2 and a 4P5T (four-pole, five-throw) switch 4. In DPDT 2 the view of the switch is shown in 3-dimensions, and then from beneath: the switch itself is the solid rectangle, 3-dimensional view, with six leads exiting the bottom. FIG. 1 shows that dual-throw switches are normally illustrated with common leads in the center position, and switches with a larger number of settings are illustrated with common leads at the end. The two settings of the DPDT switch are shown in 6 and 8, with electrical connections between leads indicated by thick lines. The first two settings of the 4P5T switch are shown consecutively, 10 and 12, and the fifth setting, 14. The number of throws is equal to the number of switch settings; the number of poles represents the number of independent switches that are ganged together. Ganged, multi-pole switches are used in some embodiments of the disclosed invention. The notation of switches 2 and 4 is used herein.

A prior art example of the ganged switches used to switch between different circuit topologies is illustrated in FIG. 2(*a*). The "on-on-on" variant of the DPDT switch, which has not two but three settings, illustrated in 16, 18, and 20, can provide combinations of series, parallel, and single-element selections, given two circuit elements as input. Note that, by themselves, ganged/multipole switches provide "hardwired," non-programmable selections of circuit topologies.

Flexibility and configurability are valuable characteristics in switch design. As an example application area, the history of development in the electric guitar industry demonstrates how such a switch would be beneficial. In a prior art guitar pickup topologies, Gibson electric guitars are known, to one of ordinary skill in the art, for the "thick" sound of the electric guitar. Gibson produces this sound by wiring the pickups in series. In another well-known guitar, the Fender Stratocaster, its sound is bright with bell-like harmonics, which are produced by wiring the pickups in parallel, or the guitarist can switch to a single pickup, via a switch on the surface of the guitar. The Fender Stratocaster then produces a clear and "clean" sound. In addition to series and parallel pickup-circuit topologies, guitarists have experimented with various custom-wired out-of-phase topologies. Guitarist Jimmy Page used a custom wiring of his Gibson Les Paul that provided more than twenty different circuit topologies using five switches, offering combinations of series, parallel, single pickup, and out-of-phase wiring.

As the number of pickups on the surface of the guitar grew, the range of possible pickups topologies grew. Guitarists also desired a reduction in the number of switches needed to obtain those different circuit topologies. Electra guitars, which were designed by St. Louis Music and built by Matsumoku in Japan in the 1970s and 1980s, offered five different circuit topologies of pickups in parallel, in series, and out of phase, using a single 5-way rotary switch. Paul Reed Smith has manufactured guitars since the 1980s that are similar to Electra's design, offering five different series/parallel circuit combinations using a 5-way rotary switch.

Manufacturers sought to provide musicians with a wider range of sounds to choose from while using a small number of performance-time controls and without changing the number of electronic pickups on the instrument, such as an electric guitar.

What is needed in the electric guitar industry is a simple programming apparatus that allows a musician to obtain as many pickup topologies as possible, using a minimum number of controls. Similarly, what is needed in the signal processing industry is a simple apparatus that allows a user to obtain multiple filter-circuit topologies and thereby to produce multiple filter characteristics such different frequency ranges, resonant frequencies, and filter types. Thus, depending on the number of switches, the present invention provides:

(a) a simple design for a single n-way control switch and a memory apparatus that allows the user to program the switch to produce any n circuit topologies out of a larger, combinatorial, number of possibilities; or (b) given two control switches, a simple design for an apparatus that enables the user to produce all possible combinations of series/parallel/phase and circuit topologies available.

SUMMARY OF THE INVENTION

This invention relates to a programmable switch for use in applications such as signal processing and musical instruments with electronic pickups. Specifically, the embodiments disclose a programmable switch that can produce a wide range of circuit topologies with a minimum number of controls.

In a single switch embodiment, the programmable switch has an m-throw position switch, at least one memory device, and a plurality of common and setting leads. Leads from circuit elements such as a musical instrument's pickups are connected to the leads of the programmable switch. The memory device connects to at least one switch lead and conditionally connects the switch lead to an output lead or one or more different switch leads; other switch leads may be preprogrammed, or "hardwired" to the output leads or different switch leads. Each switch setting is thus programmed to create a desired circuit topology. The m-throw position switch has m different throws, each throw of the switch connects common leads with a switch setting and connects the selected circuit topology of that setting to the switch's output.

In a dual switch embodiment, a first switch selects a subset of circuit pickups and a second switch selects the circuit topology for the selected elements. Each switch may be programmable as described above. The pickup selection switch has an m-throw position switch. Leads from pickups are connected to inputs of the switch. Each switch setting or throw-position may connect a different subset of circuit elements to the switch's output. The m-throw position switch has m different throws, each throw of the switch connects the selected circuit elements to the input of the topology selection switch.

The topology selection switch has an n-throw position switch. Each switch setting or throw is wired to produce a circuit topology that combines the switch's inputs, for example inputs wired in series, in parallel, in phase or out of phase. The n-throw position switch has n different throws, each throw of the switch (i.e., each setting of the switch) connects the selected circuit topology of that setting to the output of the switch.

No previous passive switch implementation has achieved the level of programmability of the disclosed invention or has been able to program every circuit combination with only two main control switches. For instance, in electric guitars, previous switching designs have hard-wired one or more pickups to ground, thereby limiting the available circuit topologies. However, the programmable switch of the dual switch embodiment of the present invention can attach both the signal and ground leads from each pickup to the element selection switch, which enables the user to program every possible pickup-circuit topology. The programmable single-switch embodiments benefit similarly.

Another novel aspect is the use of a memory device such as simple program banks to program the behavior of a switch.

Finally, in the dual switch embodiment, the clear division in the circuit design between the element selection and topology selection switches gives a greater range of pickup topologies than in prior art ad hoc designs. Prior art ad hoc designs blurred the division of element and topology selection in the circuit and thus limited the range of circuit topologies available.

BRIEF DESCRIPTION OF THE DRAWINGS

FIG. 4 is a Hardware Description Language (HDL) embodiment of FIG. 3.

FIG. 15 shows an alternate wiring arrangement for the circuit in the FIG. 7 embodiment, using rotary switches.

DETAILED DESCRIPTION OF EMBODIMENTS

The programmable switch of the present invention has a wide range of embodiments. In the current state of electronics technology, as would be recognized by those skilled in the art, the line between hardware and software continues to blur. Thus, the disclosed switch could be implemented in hardware, software, or a mix of hardware and software and still be covered by the programmable switch of the present invention.

A Single Switch Embodiment

Figure 3:
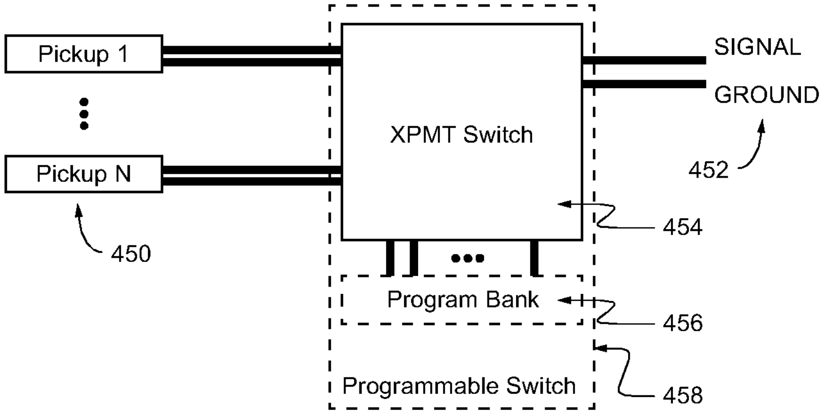
FIG. 3 is the single switch embodiment.

FIG. 3 shows the single switch embodiment, which connects input circuit elements to its output, labeled here as SIGNAL and GROUND for purposes of illustration, all leads of the circuit elements connect to the input of the switch, and the selected output circuit topology is on the SIGNAL and GROUND outputs. All circuit-element leads need not connect directly to the switch (e.g., one or more could connect directly to OUTPUT or GROUND), but the more leads that do, the more flexible the arrangement. The hardware embodiments may use ganged switches and use memory devices such as jumpers, DIP switches, fuses, latches or flip-flops in conjunction with electronic switches such as transmission gates, or any other suitable technology for the memory device. The ganged switches come in a wide variety of switch settings, such as a two-pole five-throw, dual-pole dual-throw, or four-pole five-throw switches. A "jumper" is a simple U shaped metal connector that enables an electrical connection between two electrical lines on a printed circuit board.

A HDL Single Switch Embodiment

An embodiment of the programmable single switch in a HDL, Verilog is disclosed using VerilogAMS. However, any hardware description language is just as suitable. HDLs allow the simulation, verification and test of a design before any hardware or software components are built. Verilog allows for the description of a design at a behavioral level, a register level (RTL), or a gate level description. Once the Verilog code is tested and verified it could be implemented in for example PLDs, ASICs, or Field Programmable Gate Arrays (FPGAs).

FIG. 4 is a Verilog embodiment of the programmable switch shown in FIG. 3. The Verilog code can implement the embodiment in many forms, including an FPGA, a PLD, an ASIC, or software running on a processor core.

A hardware description language (HDL) is a software language used to design integrated circuits (ICs) Verilog is one of the best-known HDLs. An HDL is used to design and test ICs in software before the circuit is physically implemented in programmable logic, for example, in a programmable logic device (PLD). An embodiment of the programmable single switch in a HDL, Verilog is disclosed using VerilogAMS. However, any hardware description language is just as suitable. PLDs have a limited number of logic gates and implement simple logic functions like the single and dual topology switch designs of the enclosed embodiments. However, the switches of this invention could be implemented in any programmable logic.

Figure 5:
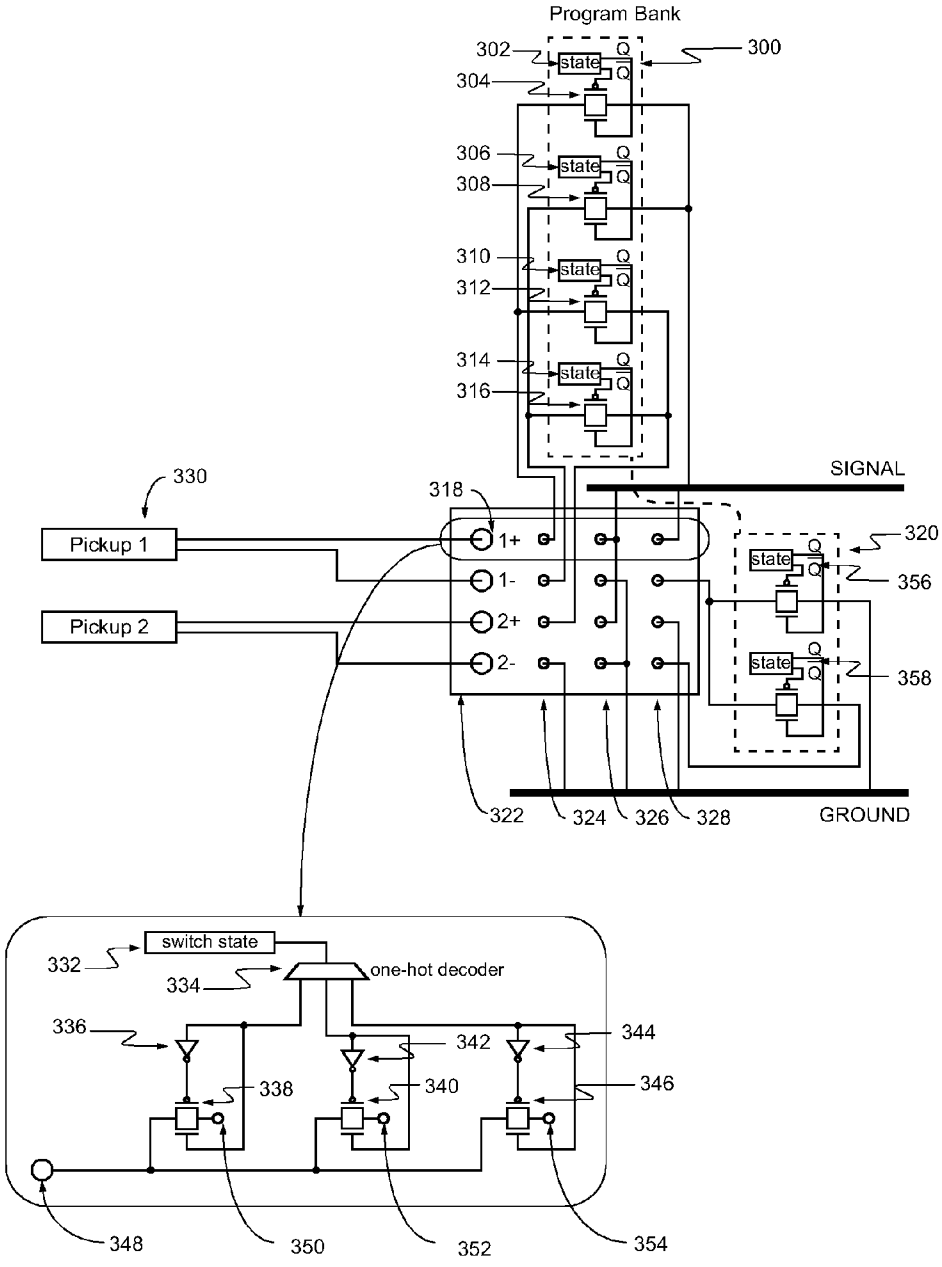
FIG. 5 is an Application Specific Integrated Circuits (ASIC) embodiment of the programmable pickup mode selection switch.

The components shown in the FIG. 4 are the Verilog software modules that combined will compile into an embodiment of a programmable switch shown in FIG. 5. The connect( ) and disconnect( ) macros are verilog-AMS notation to show that two wires throughout the FIG. 4 code are connected or not connected to each other. The following four modules are the components of the final programmable 4P3T switch module (prog__3way_switch) which is an embodiment of the single programmable switch. That final module, prog__3way_switch, is shown at the bottom of FIG. 4.

The onOff_switch module implements a single 1P1T switch. The wires "common" and "lead" are connected if the switch's state is 1, and disconnected otherwise. The state could be a value read from a memory cell or generated by combinational logic, or it could be a physical state such as a jumper being set, a switch lever or dial being placed in an "on" or "off" position, or a fuse being set or blown, inter alia, the module represents the behavior of a MOSFET or MOSFET pair implementing a transmission gate, the implementation shown in FIG. 5.

Figure 1:
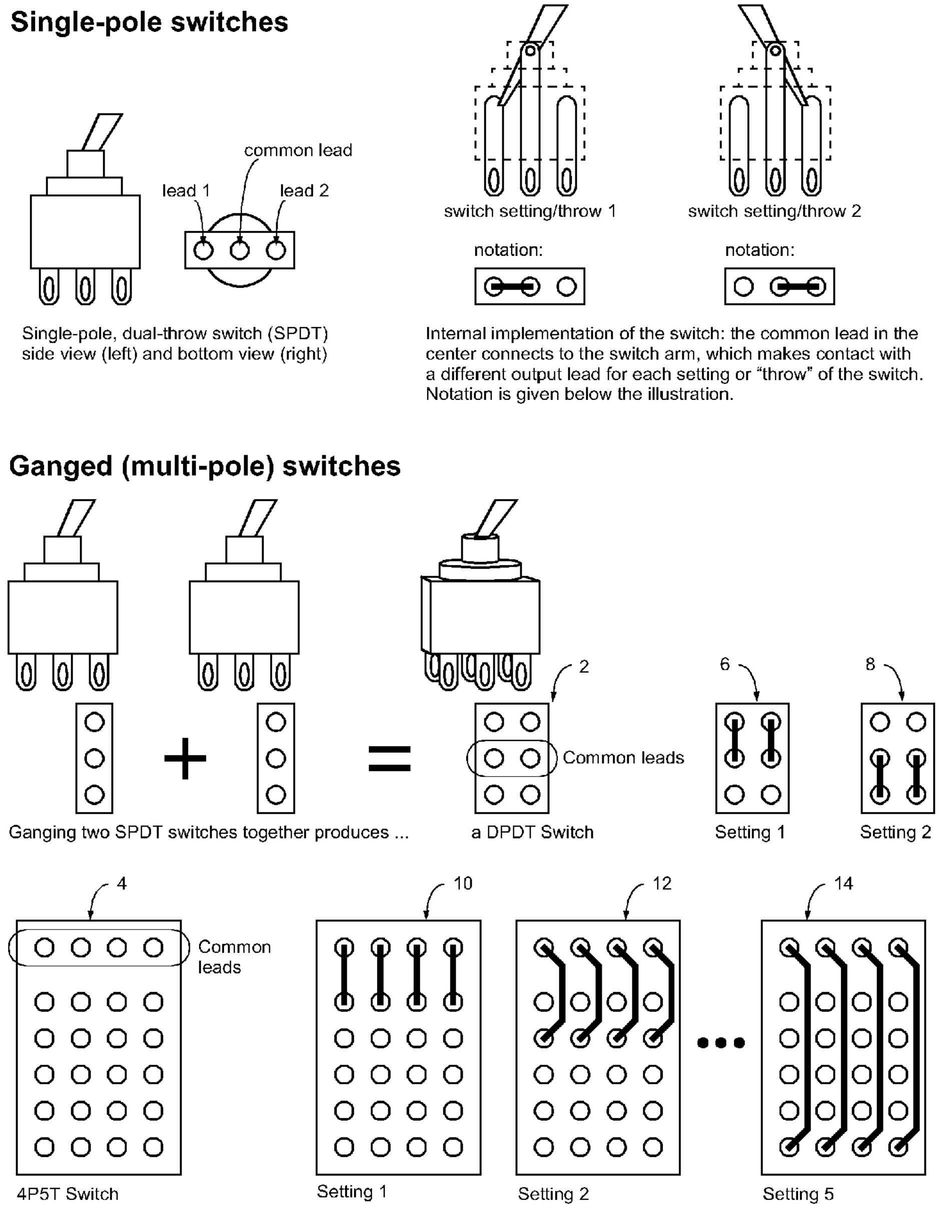
FIG. 1 is a full description of prior art single pole and ganged multi-pole operation and the notation used herein to describe those switches.
Figure 2:
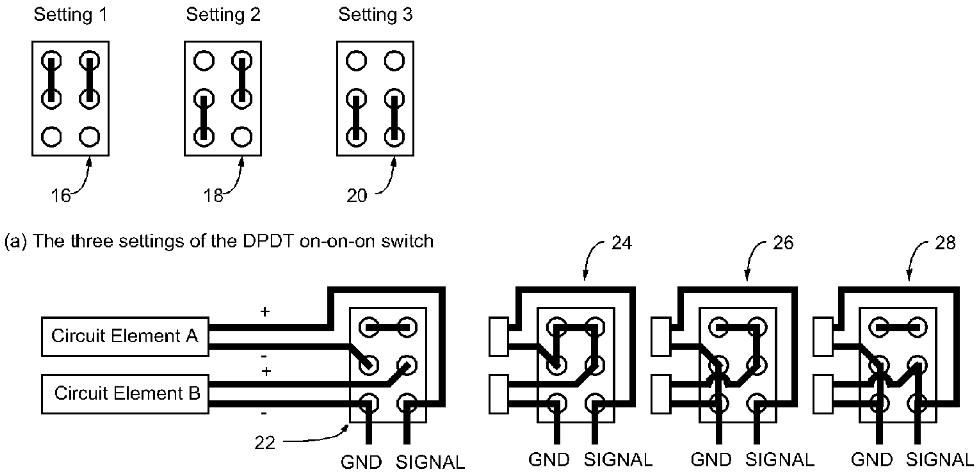
FIG. 2 is an example of a prior art usage of an on-on-on DPDT switch operation.

The programBank6 module groups together six onOff_switch blocks, i.e., it is an instance of Program Bank B 44 shown in FIG. 3. In this embodiment, the number of switches the Program Bank contains is six. Additionally, in this embodiment, the switches are independent and not ganged together with a common switch state, as are the ganged switches shown in FIG. 1.

The 1p3t_switch module implements a single three-way switch. A 1P3T switch is similar in function to the single pole, multiple throw switches shown in FIG. 1. The "common" wire is connected to one and only one of the wires "lead1" "lead2" and "lead3" in a three state switch. If the switch's state is "1", the "common" wire is connected to the "lead1" wire; if the switch's state is "2", the "common" wire is connected to the "lead2" wire; if the switch's state is "3", the "common" wire is connected to the "lead3" wire.

As in the onOff_switch module and other modules requiring an input state, the three-way switch's state can come from a wide variety of sources. Such as, but not limited to values read from two or more memory cells or generated by combinational logic, or binary values of two or more jumpers, a switch lever or dial being placed in one of three different positions, or two or more fuses being set or blown.

The 4p3t_switch module gangs together four 1P3T switches. The three 1P3T switches are all driven off the same switch state, and are thus "ganged" in the sense depicted in FIG. 1.

The prog__3way_switch module is an embodiment of the programmable switch, using the Verilog modules described above. The prog__3way_switch module combines a switch (represented by switch state) and a program bank (represented by progbankstate and programBank6) and uses these two to decide how to connect the leads of two different circuit elements to two outputs (signal and ground). The programmable switch can put the two elements in series, in series out of phase, in parallel, or in single-element mode. The "electrical" components are wires that connect to the 4P3T switch (leads1, leads2, leads3) and the program bank (leftside and rightside). The inter-module connections are given in the HDL code.

Other Single Switch Embodiments

FIG. 5 illustrates an implementation of the embodiment shown in FIG. 4. The FIG. 5 embodiment uses transmission gates to implement both the 4P3T switch 322 and the on/off switch elements (304, 308, 312, 316) of the program bank 300, 320. This implementation represents one embodiment of the invention as it would be implemented, in an integrated circuit (IC) such as a programmable logic device or an ASIC. Each transmission gate, e.g., 304, a switch controlled by some state, e.g., 302, for example a register, fuse, or jumper, is the programmable memory device. In the FIG. 5 embodiment the state controls the transmission gate by turning the two MOSFETs on or off together: when the state value is logic high ("1"), Q=1 and Qbar=0, so both MOSFETs are on (conducting); when the state value is logic low ("0"), Q=0 and Qbar=1, so both MOSFETs are turned off (non-conducting).

The bottom of FIG. 5 illustrates how transmission gates can implement a three-throw switch. A switch state 332 that can have three possible values is connected to a one-hot decoder 334 that takes the state as input and produces a three-wire output, and at any moment exactly one of the output wires has logic high on it, while the other two wires have logic low on them. This turns on exactly one of the transmission gates and turns off the other two, so at any moment the common input port 348 is electrically connected through the transmission gates 338, 340, and 346, to one and only one output port in the set of 350, 352, and 354. Inverters 336, 342, 344 are shown to indicate that the two MOSFETs that make up each transmission gate 338, 340, 346 take complementary inputs. As indicated in the picture, one can gang together four of these three-throw switches to implement a 4P3T switch 322.

The first four on/off switches in the program bank 300 determine the behavior of the first setting 324 of the switch 322: if the state values 302, 306, 310, and 314 are logic 1, 0, 0, 1 (respectively), then the transmission gates 304, 308, 312, and 316 are on, off, off, on (respectively), which connects Circuit Element 1's input lead (labeled "1+") to SIGNAL and connects Circuit Element 1's output lead (labeled "1−") to Circuit Element 2's input lead (labeled "2+"). This puts Circuit Element 1 in series with Circuit Element 2. On the other hand, if the state values 302, 306, 310, and 314 are logic 0, 1, 1, 0 (respectively), then the transmission gates 304, 308, 312, and 316 are off, on, on, off (respectively), which connects Circuit Element 1's output lead (labeled "1−") to SIGNAL and connects Circuit Element 1's input lead (labeled "1+") to Circuit Element 2's input lead (labeled "2+"). This puts Circuit Element 1 in series with Circuit Element 2, with Circuit Element 1 wired out of phase. Thus, by setting the state values in 300 appropriately, one can program setting 1, 324 of the switch 322 to produce a series/in-phase topology or a series/out-of-phase topology.

The last two on/off switches in the program bank 320 determine the behavior of the third setting 328 of the switch 322: if the state values 356 and 358 are logic 1, 0 (respectively), then the corresponding transmission gates are on, off (respectively), which connects Circuit Element 1's output lead (labeled "1−") to GROUND. This gives a single-element circuit topology wherein Circuit Element 1 is part of the circuit, but Circuit Element 2 is not. If the state values 356 and 358 are logic 0, 1 (respectively), then the corresponding transmission gates are off, on (respectively), which connects Circuit Element 1's output lead (labeled "1−") to Circuit Element 2's input lead (labeled "2+"). This puts Circuit Element 1 in series with Circuit Element 2. Thus, by setting the state values in 320 appropriately, one can program setting 3, 328 of the switch 322 to produce a single-element topology or a series/in-phase topology. Setting 2, 326 of the switch 322 is hard-wired to put Circuit Element 1 in parallel with Circuit Element 2.

Figure 6:
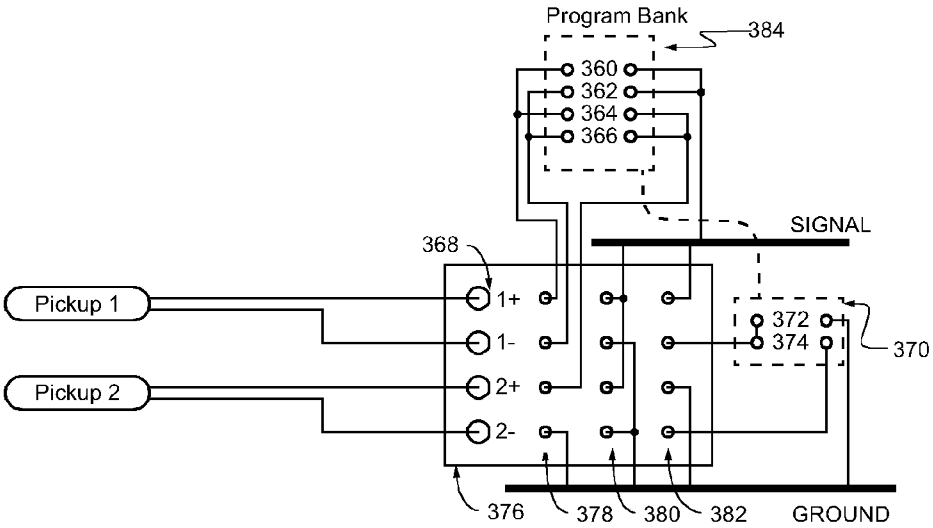
FIG. 6 is a hardware embodiment of the same switch described in the HDL of FIG. 4.

FIG. 6 illustrates a specific application of the Verilog embodiment shown in FIG. 4 and the IC embodiment shown in FIG. 5, by providing an alternative embodiment as could be used in an electric guitar. Note that, for clarity, additional subcircuits such as those for volume and tone are omitted in illustrations for musical instruments. In FIG. 6 a 4P3T switch is programmable to put Pickups 1 and 2 in series/in-phase, series/out-of-phase, parallel, and single-pickup topologies. In this implementation, the memory devices (for example 360, 362, 364, and 366) are shown as jumpers, hard fuses, or programmable fuses that can be set closed or open, indicating the presence or absence of electrical connections across the terminals.

Just as FIG. 5, the first four memory devices in the program bank 384 determine the behavior of the first setting 378 of the switch 376: if the memory devices 360, 362, 364, and 366 are set closed, open, open, closed (respectively), then Pickup 1's input lead (labeled "1+") is connected to SIGNAL and Pickup 1's output lead (labeled "1") is connected to Pickup 2's input lead (labeled "2+"). This puts Pickup 1 in series with Pickup 2. On the other hand, if the memory devices 360, 362, 364, and 366 are set open, closed, closed, open (respectively), then Pickup 1's output lead (labeled "1−") is connected to SIGNAL and Pickup 1's input lead (labeled "1+") is connected to Pickup 2's input lead (labeled "2+"). This puts Pickup 1 in series with Pickup 2, with Pickup 1 wired out of phase. Thus, by setting the memory devices in 384 appropriately, one can program setting 1, 378 of the switch 376 to produce a series/in-phase topology or a series/out-of-phase topology.

The last two memory devices in the program bank 370 determine the behavior of the third setting 382 of the switch 376: if the memory devices 372/374 are set closed/open (respectively), then Pickup 1's output lead (labeled "1−") is connected to GROUND. This gives a single-pickup circuit topology wherein Pickup 1 is heard, but Pickup 2 is not part of the circuit. If the memory devices 372/374 are set open/closed (respectively), then Pickup 1's output lead (labeled "1−") is connected to Pickup 2's input lead (labeled "2+"). This puts Pickup 1 in series with Pickup 2. Thus, by setting the memory devices in 370 appropriately, one can program setting 3, 382 of the switch 376 to produce a single-pickup topology or a series/in-phase topology. Setting 2, 380 of the switch 376 is hard-wired to put Pickup 1 in parallel with Pickup 2.

Figure 7:
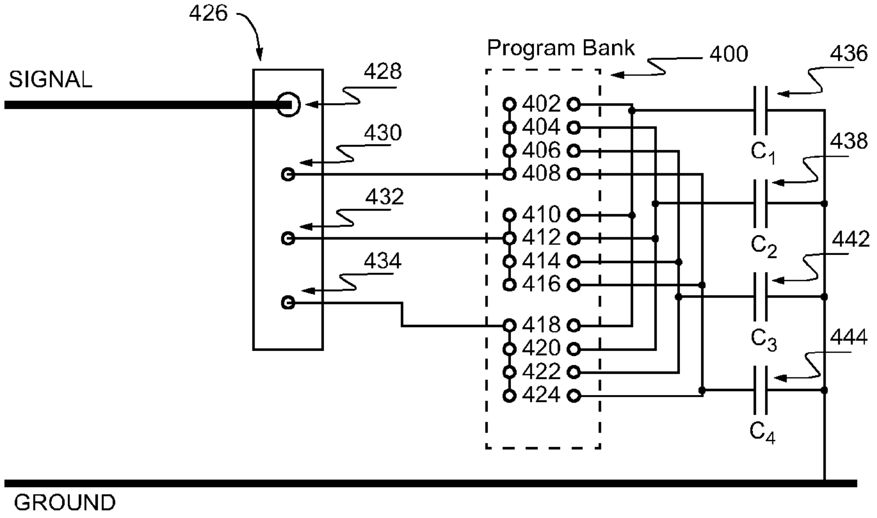
FIG. 7 is an embodiment of a variable-capacitance switch, for use in parametric filters.

FIG. 7 shows an embodiment of the single-switch embodiment for use in signal processing applications. A single-pole, three-throw (1P3T) switch 426 is connected to four different capacitors 436 438 442 444 via a program bank of fuses 400 in a configuration that enables different combinations of capacitors to be programmed. The capacitors 436 438 442 444 are wired in parallel, and capacitances in parallel add; furthermore, the embodiment enables the capacitors to be added separately and independently for each of the three switch settings 430 432 434. For example, if fuses 402, 410, 412, 420, and 424 are set such that they are closed (conducting), and the rest are set open (nonconducting), then setting 1 of the switch 430 creates a capacitance across SIGNAL and GROUND of $C_1$; setting 2 of the switch 432 creates a capacitance across SIGNAL and GROUND of $C_1+C_2$; and setting 3 of the switch 434 creates a capacitance across SIGNAL and GROUND of $C_2+C_4$.

The embodiments in FIGS. 5 and 6 provide examples of a single switch embodiment choosing both elements of a circuit and a resulting circuit topology (for example, the switches can choose Element 1 alone or Elements 1 and 2 in series or parallel). The embodiment in FIG. 7 provides an example of a single switch embodiment that chooses elements of a circuit within a fixed topology. A single switch embodiment could also choose only topologies of a fixed set of circuit elements (such as would be the case in FIG. 6 if jumper 372 was removed from the illustration, and in place of jumper 374 was a fixed wire).

A Pre-Programmed Dual Switch Embodiment

Figure 8:
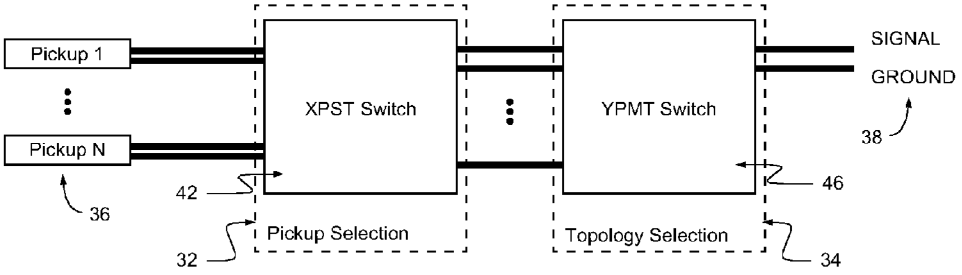
FIG. 8 is a dual switch, pickup selection and mode selection switch embodiment the switch, preprogrammed permanent user-selected settings.

In a dual switch embodiment the functions of element selection and topology selection can be separated. FIG. 8 shows a preprogrammed dual switch embodiment; that is, the element-selection and topology-selection switches need not be programmable. This embodiment segregates circuit-element selection from circuit-topology selection: the first switch chooses a subset of the circuit elements; the second switch places the chosen elements into different circuit topologies.

Prior art ad hoc designs, for example dual-switch designs for electric guitars, blurred the division of element (pickup) selection and topology selection circuitry limiting the range of circuit topologies available to a user. Whereas in the disclosed embodiments the clear division in the circuit design between the element selection and topology selection gives a greater range of circuit topologies.

Additionally, the clear division of circuit design between element selection and topology selection reduces the likelihood that the implementation contains design bugs. For example, the dual-switch implementation in US Patent Application 2005/0150364 A1 has a bug that is largely due to this blurring of functions. In the specification, the first switch (the 6P3T switch) performs both element (i.e. pickup) selection and topology selection; it selects single pickups, humbucking pickups, separate pickups, and coil-tapped pickups. The second switch (the 2P5T switch) also performs both element selection (which pickups to combine) and topology selection (whether the pickups are in series humbucking mode or wired in parallel). As a result of this blurring of functions, the designers overlooked an obvious wiring that would have produced 15 unique circuit topologies instead of the 13 unique topologies that the implementation actually produces.

The Programmable Element Selection and Topology Selection Switch

Figure 9:
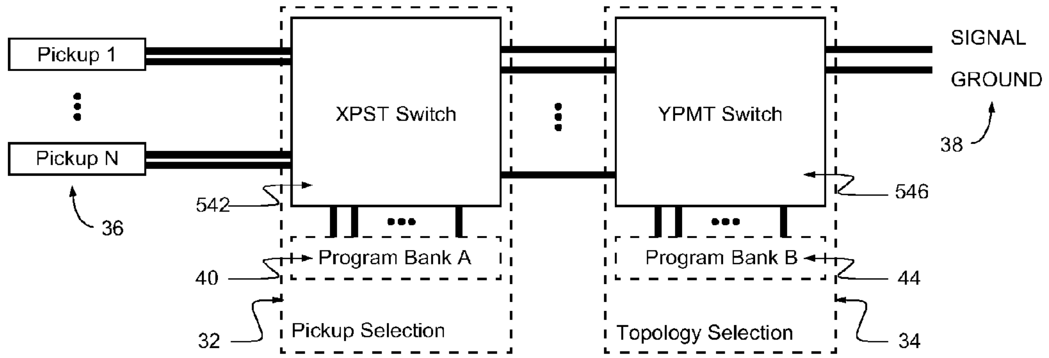
FIG. 9 is a programmable dual switch embodiment.

An embodiment of a programmable element selection and topology selection switch is shown in FIG. 9. A programmable switch 32 is connected to another programmable switch 34. The programmable switch 32 connected to the circuit elements 36 is responsible for element selection; the programmable switch 34 connected to SIGNAL and GROUND 38 is responsible for topology selection, i.e., the circuit topology of the selected circuit elements.

Program Bank A 40 is a set of memory devices (e.g., jumpers or DIP switches or registers paired with transmission gates or similar technologies) that programs the behavior of switch 542. Similarly, Program Bank B 44 is a set of memory devices (e.g., jumpers or DIP switches or registers paired with transmission gates or similar technologies) that programs the behavior of switch 546.

Figure 10:
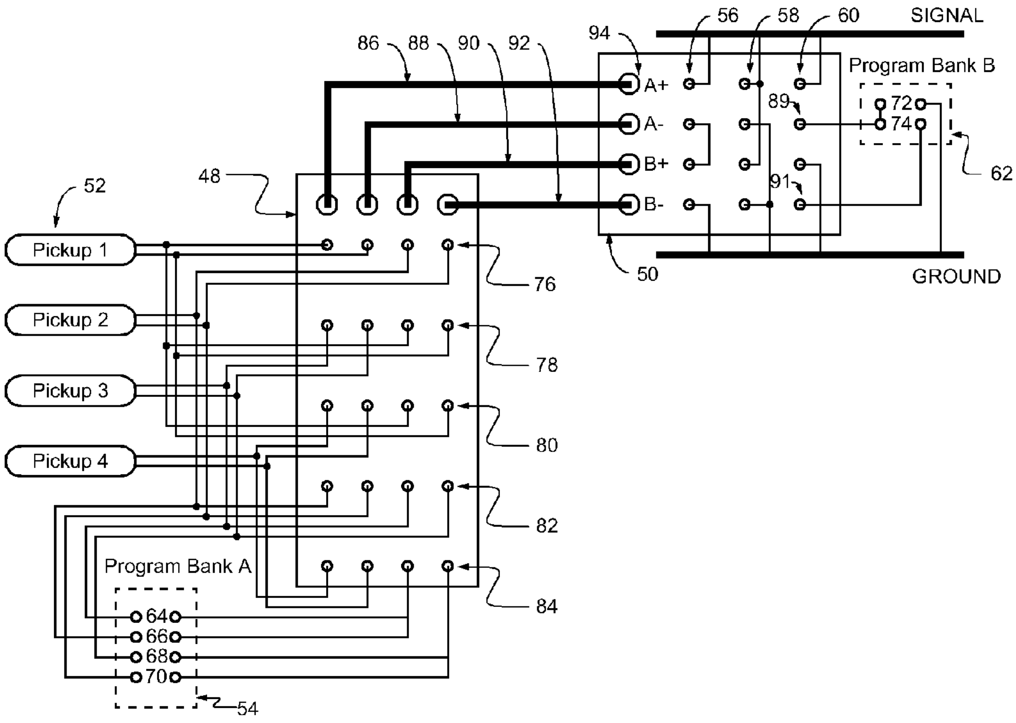
FIG. 10 is an embodiment of the FIG. 9 programmable dual switch embodiment.

FIG. 10 shows an example of this embodiment in action, specifically as a switch for a musical instrument: a 4P5T switch 48 is used for pickup selection; a 4P3T switch 50 is used for topology. The embodiment can select five pickup combinations and three distinct circuit topologies for each pickup combination. In this embodiment, the number of pickups 52 is 4 (e.g., as would be the case in a two-humbucker arrangement), and the circuit enables every possible combination of two pickups in parallel and series, and it also enables either the selection of any of the four pickups singly or any two pickups in series and out of phase.

The pickup selection switch 48 selects the SIGNAL (+) and GROUND (−) leads of two distinct pickups, labeled 94 in the figure as outputs A+/A− and B+/B−. Note that, given 4 pickups as input, there are six possible combinations of choosing any 2 pickups (4 choose 2 is 6), but the pickup selection switch 48 is only a 5-throw switch. Thus, only 5 of the 6 possible pickup combinations will be available at any given time. Four of the five combinations are hard-wired (switch settings 1, 2, 3, and 4, which correspond to 76, 78, 80, and 82 respectively), and Program Bank A 54 allows the user to select which of the remaining two pickup combinations are chosen by the fifth switch position. Switch setting 1, 76 chooses pickup combination (1, 2); setting 2, 78 chooses pickup combination (1, 3); setting 3, 80 chooses pickup combination (1, 4); setting 4, 82 chooses pickup combination (2, 3); the remaining pickup combinations are (2, 4) and (3, 4), which have pickup 4 in common. Setting 5, 84 is hard-wired to choose pickup 4, and the choice of either (2, 4) or (3, 4) is made by the configuration of Program Bank A 54. If jumpers 64 and 68 are set, setting 5, 84 of the switch 48 will select pickup combination (3,4). If jumpers 66 and 70 are set, setting 5, 84 of the switch 48 will select pickup combination (2, 4). Note that the use of a 6-throw switch instead of a 5-throw switch for pickup selection 48 would make all six pickup combinations available and thus would obviate Program Bank A 54.

The 4P3T switch 50 is used for topology selection; it takes as input from the pickup selection switch 48 four leads 86, 88, 90, 92, which represent the signal and ground leads of two distinct pickups in the figure. Lead 86 corresponds to the SIGNAL lead of pickup A ("A+"); lead 88 corresponds to the GROUND lead of pickup A ("A−"); lead 90 corresponds to the SIGNAL lead of pickup B ("B+"); and lead 92 corresponds to the GROUND lead of pickup B ("B−")). The topology selection switch 50 taken together with Program Bank B 62 enables the selection of pickups in series (setting 1, 56), pickups in parallel (setting 2, 58), and a programmable selection for setting 3, 60. Program Bank B 62 conditionally connects lead 88 to GROUND and/or lead 90. If jumper 72 is set, pin 88 is connected to GROUND, and setting 3, 60 of the switch 50 represents a single-pickup mode. If jumper 74 is set, pin 89 is connected to pin 91, thereby connecting leads 88 and 92 in setting 3, and it can be seen that setting 3, 60 of the switch 50 represents a series connection of the two input pickups, with the two pickups wired out of phase with each other.

In the illustrated embodiment, the poles of the two switches are tied together. Note that this is not a requirement or limitation of the invention; for example, in many cases a more powerful switch, such as one with more throws or more poles, can emulate the behavior of a simpler switch (e.g., the 4P5T pickup-selection switch pictured in FIG. 10 can be replaced by an 8P5T switch turned sideways).

Figure 11:
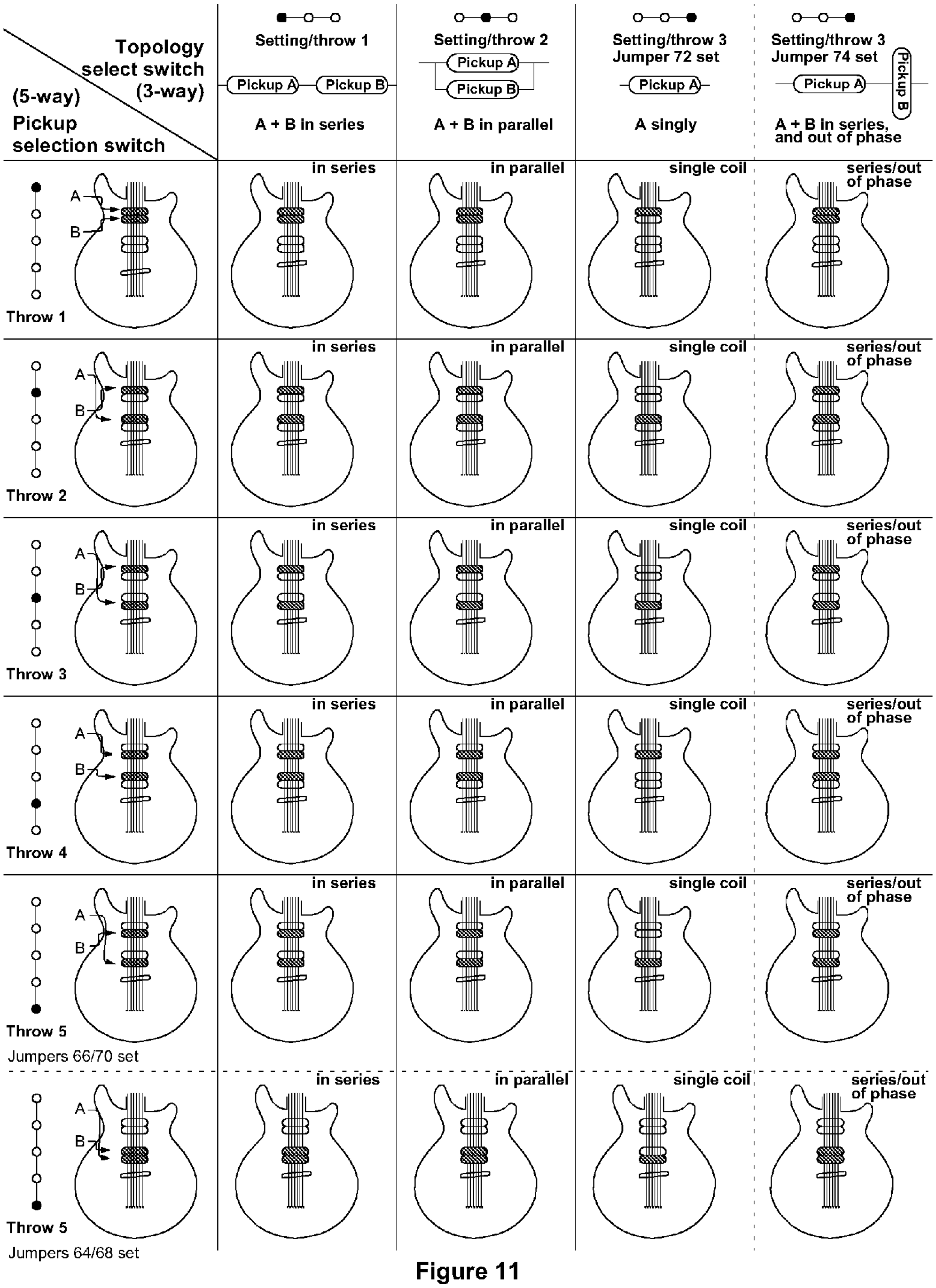
FIG. 11 shows pickup topologies available in the FIG. 10 embodiment of the programmable dual switch.

The circuit topologies available with the FIG. 10 embodiment are shown in FIG. 11. Active pickups are shown in grey tones; inactive pickups are shown without color (white). The combination of 5-way switch and 3-way switch produces 15 circuits, of which 14 are unique when jumper 72 is set (when using four pickups, there are only 4 unique single-pickup circuit topologies; using 5 pickups would produce 15 unique circuit topologies). The use of jumper blocks to program the two switches provides allows a user to program, in a very simple manner, additional topologies.

This embodiment enables every possible combination of two pickups wired in series/in-phase, parallel, and either single-pickup or series/out-of-phase. The only factor that limits the variety of topologies is the size of the switches involved; for example, all six combinations of the four pickups would be available were one to use a 4P6T switch for pickup selection instead of the 4P5T switch 50, and, were one to use a 4P4T switch for topology selection instead of the 4P3T switch 52, both single pickup and series/out-of-phase modes would be available simultaneously via switch selections at performance time, as opposed to the mutually exclusive arrangement illustrated by the Program Bank B example implementation 62 in FIG. 3. Thus, with a 4P6T switch and a 4P4T switch, all 24 (22 unique) circuit topologies shown in the figure would be available at performance time.

Figure 12:
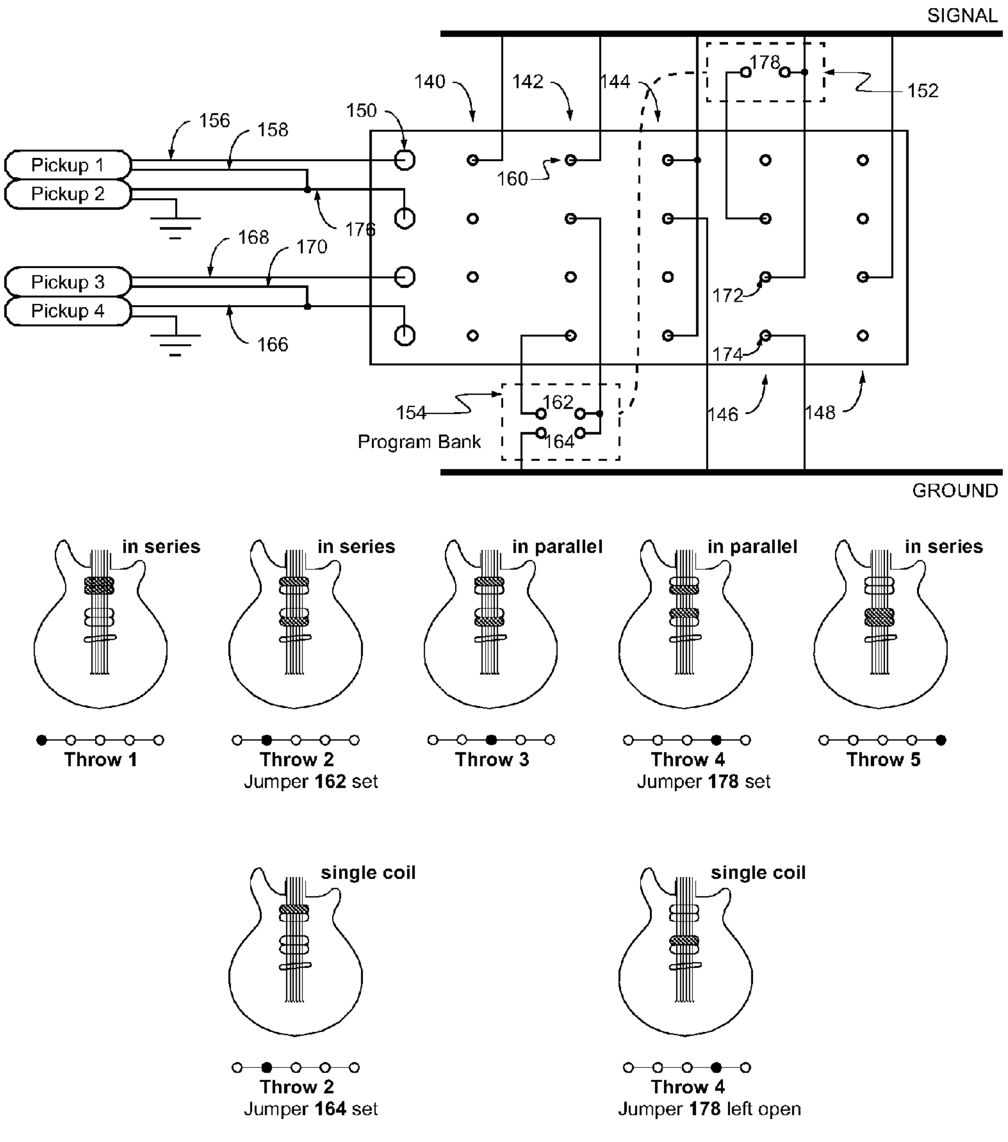
FIG. 12 is an embodiment of FIG. 3 programmable switch and the pickup topologies available in the embodiment.

FIG. 12 shows an embodiment of a single programmable switch in an electric guitar application where several circuit-element leads that were kept separate in previous examples are wired together or hard-wired to the switch's outputs, in this case SIGNAL or GROUND. This embodiment adapts itself to the limitations of a 4-pole switch, and it reflects the standard wiring of many commercial pickups. For example, those having three leads: SIGNAL, GROUND, and COIL-CUT.

The embodiment in FIG. 12 provides the following circuit topologies for the switch's five settings, in which switch settings 1, 3, and 5 (140, 144, and 148 respectively) are hard-wired, and switch settings 2 and 4 (142 and 146 respectively) are programmable through the Program Bank 152/154.

- Switch position 1 wires the setting 1 leads 140 to the common leads 150, and the resulting output selection represents Pickup 1 wired in series with Pickup 2.
- Switch position 2 has Pickup 1's positive lead 156 hard-wired to SIGNAL via pin 160. Pickup 1's negative lead 158 is conditionally wired though jumpers 162 and 164 of Program bank B 154 to either ground or the positive lead of Pickup 4 166. When jumper 162 is set, Pickup 1's negative lead 158 is wired to Pickup 4's positive lead 166, and the resulting output selection represents Pickup 1 wired in series with Pickup 4. When jumper 164 is set, Pickup 1's negative lead 158 is wired to GROUND, and the resulting output selection represents Pickup 1 wired singly.
- Switch position 3 wires the setting 3 leads 144 to the common leads 150, and the resulting output selection represents Pickup 1 wired in parallel with Pickup 4.
- Switch position 4 has Pickup 3's positive lead 168 hard-wired to SIGNAL via pin 172 and Pickup 3's negative lead 170 hard-wired to GROUND via pin 174. Pickup 2's positive lead 176 is conditionally wired through jumper 178 to SIGNAL. When jumper 178 is set, the resulting output selection represents Pickup 2 wired in parallel with Pickup 3. When jumper 178 is left open (not set), the resulting output selection represents Pickup 3 wired singly.
- Switch position 5 wires the setting 5 leads 148 to the common leads 150, and the resulting output selection represents Pickup 3 wired in series with Pickup 4.

Figure 13:
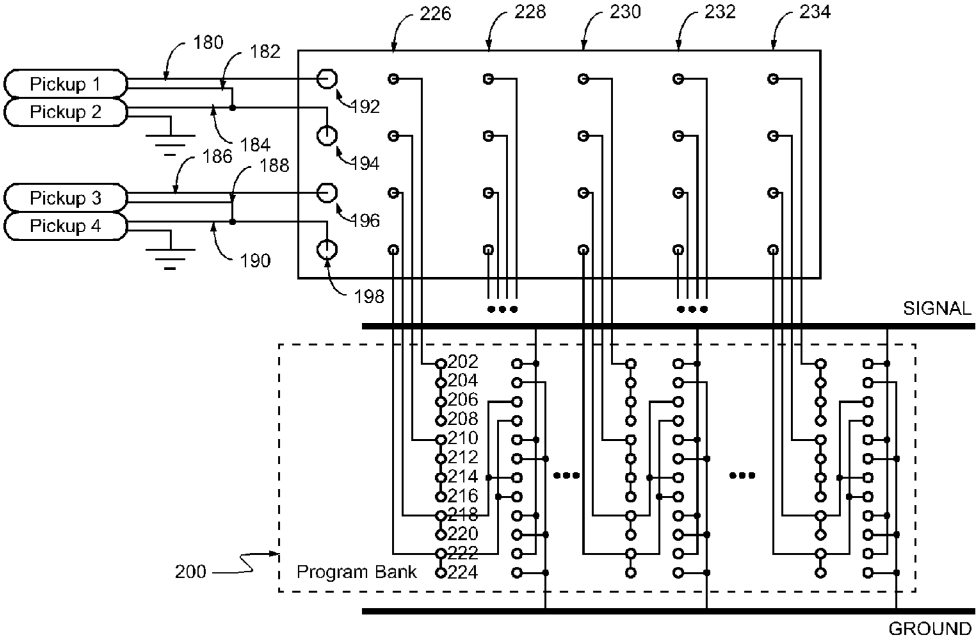
FIG. 13 is a complex embodiment of FIG. 3 programmable switch.

As an alternative, FIG. 13 illustrates a relatively complex embodiment that uses a 4P5T switch with an extensive set of jumpers that enables the selection of a wide range of circuit topologies.

This embodiment offers every combination of Pickups 1-4 that is possible given the limitations that Pickups 2 and 4 are wired to ground (and thus, for example, they cannot be wired in series with each other) and that Pickup 1 is hard-wired to Pickup 2 while Pickup 3 is hard-wired to Pickup 4 (and thus, for example, placing Pickup 1 into the circuit will necessarily also include Pickup 2 in the circuit, unless the lead corresponding to pin 194 is wired to ground, in which case Pickup 2 is grounded out). Every combination of the input leads 192, 194, 196, 198 is provided because Program Bank B 200 enables the connection from any lead to any other and also to either the output SIGNAL or the output GROUND. For instance, when the switch is set to position 1, 226, jumper 202 connects Pickup 1's positive lead 180 via the switch's common lead 192 to the output SIGNAL; jumper 204 connects Pickup 1's positive lead 180 via the switch's common lead 192 to the output GROUND; jumper 206 connects Pickup 1's positive lead 180 via the switch's common lead 192 to Pickup 3's positive lead 186 via the switch's common lead 196; and jumper 208 connects Pickup 1's positive lead 180 via the switch's common lead 192 to both Pickup 3's negative lead 186 and Pickup 4's positive lead 190 via the switch's common lead 198. Similarly, when the switch is set to position 1, 226, jumper 210 connects both Pickup 1's negative lead 182 and Pickup 2's positive lead 184 via the switch's common lead 194 to the output SIGNAL; jumper 212 connects both Pickup 1's negative lead 182 and Pickup 2's positive lead 184 via the switch's common lead 194 to the output GROUND; and so forth.

Figure 14:
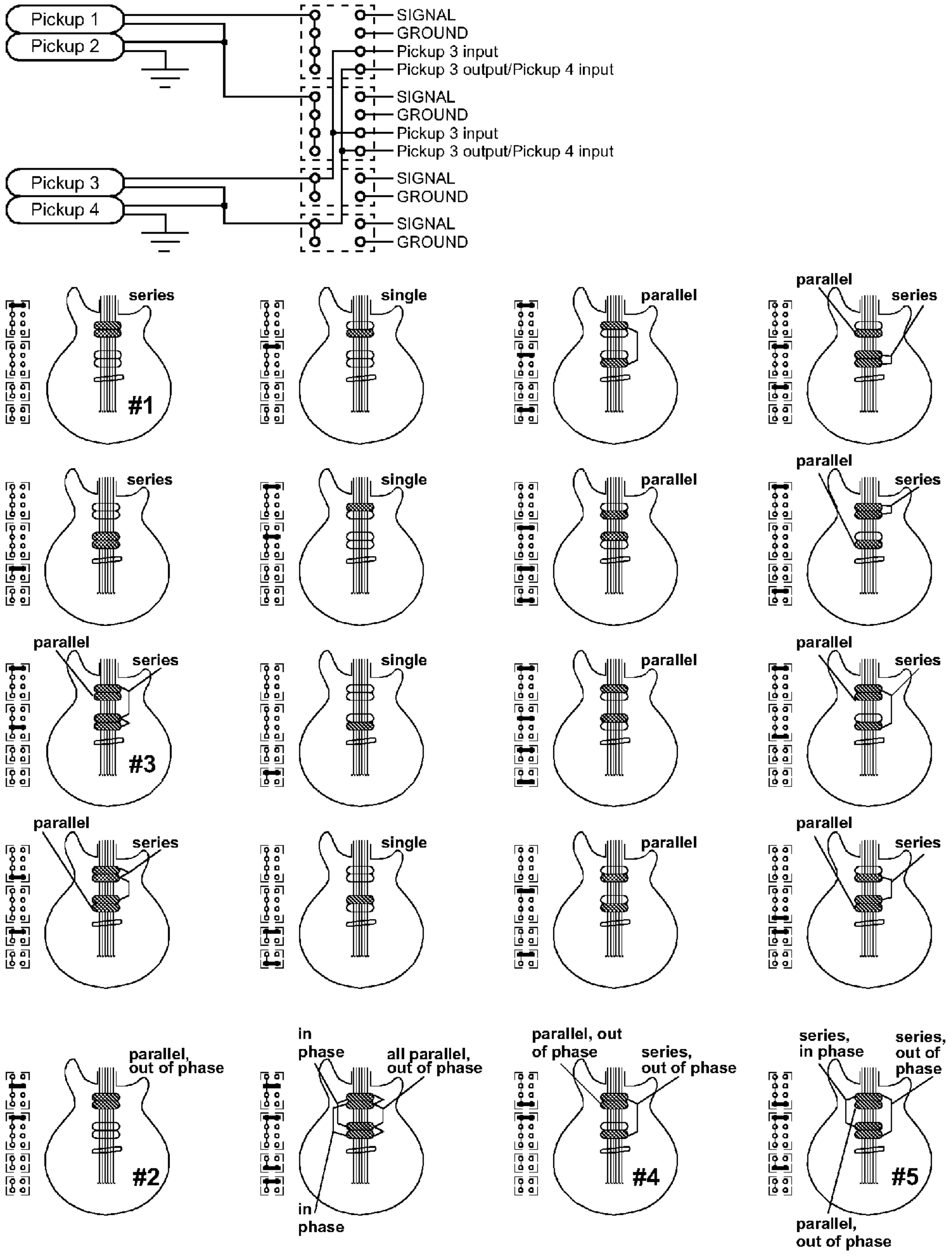
FIG. 14 shows pickup topologies available in the FIG. 12 embodiment.

FIG. 14 shows a sampling of the wide variety of circuit topologies available from the embodiment in FIG. 13. Example circuit topologies shown in FIG. 14 include the following:

1. Jumper 202 connects Pickup 1's positive lead 180 to SIGNAL in setting 1, 226; when set, it programs setting 1, 226 of the switch to select Pickup 1 in series with Pickup 2 (e.g., a normal humbucker arrangement).
2. Jumper 204 connects Pickup 1's positive lead 180 to GROUND in setting 1, 226; jumper 210 connects Pickup 2's positive lead 184 and Pickup 1's negative lead 182 both to SIGNAL in setting 1, 226. When set, these jumpers program setting 1, 226 of the switch to select Pickup 1 in parallel with Pickup 2, with the two pickups wired out-of-phase with respect to each other.
3. Jumper 202 connects Pickup 1's positive lead 180 to SIGNAL in setting 1, 226; jumper 214 connects Pickup 2's positive lead 184 and Pickup 1's negative lead 182 both to Pickup 3's positive lead 186 in setting 1, 226. When set, these jumpers program setting 1, 226 of the switch to select Pickups 1, 3, and 4 in series, with Pickup 2 in parallel with Pickups 3 and 4.
4. Jumper 210 connects Pickup 2's positive lead 180 and Pickup 1's negative lead 182 both to SIGNAL in setting 1, 226; jumper 208 connects Pickup 1's positive lead 180 to both Pickup 3's negative lead 188 and Pickup 4's positive lead 190 in setting 1, 226. When set, these jumpers program setting 1, 226 of the switch to select Pickups 1 and 4 in series, with Pickup 1 wired out of phase, and with Pickup 2 in parallel with both Pickups 1 and 4, out of phase with respect to Pickup 1.
5. Additionally to #4 above, jumper 220 connects Pickup 3's positive lead 186 to GROUND in setting 1, 226. When set, it brings Pickup 3 into the circuit, in parallel with Pickup 4 and in series with Pickup 1, out of phase with Pickup 4 (and thus in phase with Pickup 1).

Settings 2, 3, 4, and 5 (FIG. 13: 228, 230, 232, 234) can be programmed independently of the configuration programmed for setting 1 226. An 8-pole switch would enable any possible circuit combination of four input pickups.

The implementation of memory devices is not a limitation of the invention. As FIG. 15 shows, the program bank and its constituent memory devices can be implemented in many different ways: FIG. 15 shows an alternative circuit that implements the embodiment of FIG. 7 using rotary switches instead of jumpers, DIP switches, transmission gates, etc. For reference, the behavior of a hexadecimal rotary switch (part of the existing prior art) is given at the bottom of the figure.

Figure 16:
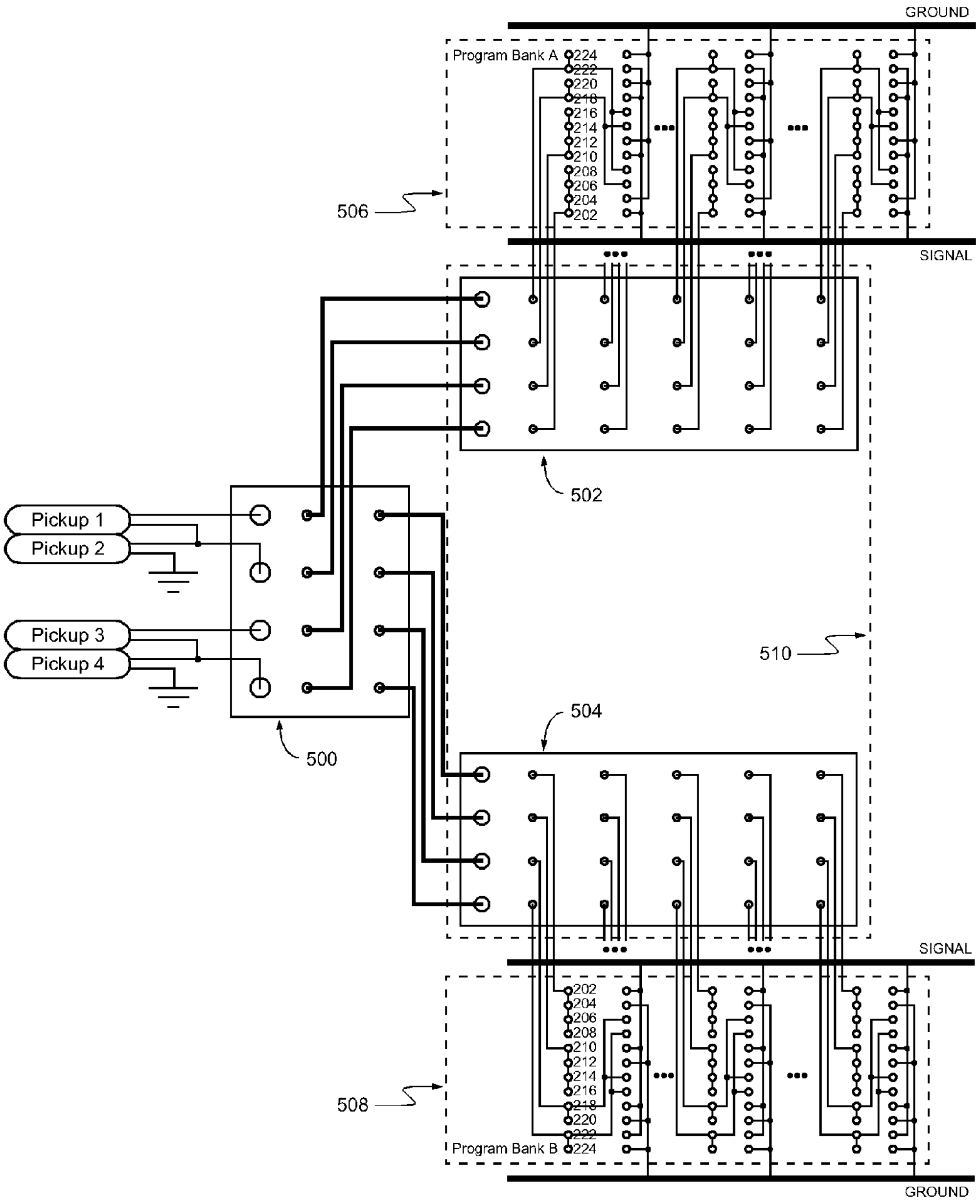
FIG. 16 shows a multi-switch embodiment.
Figure 17:
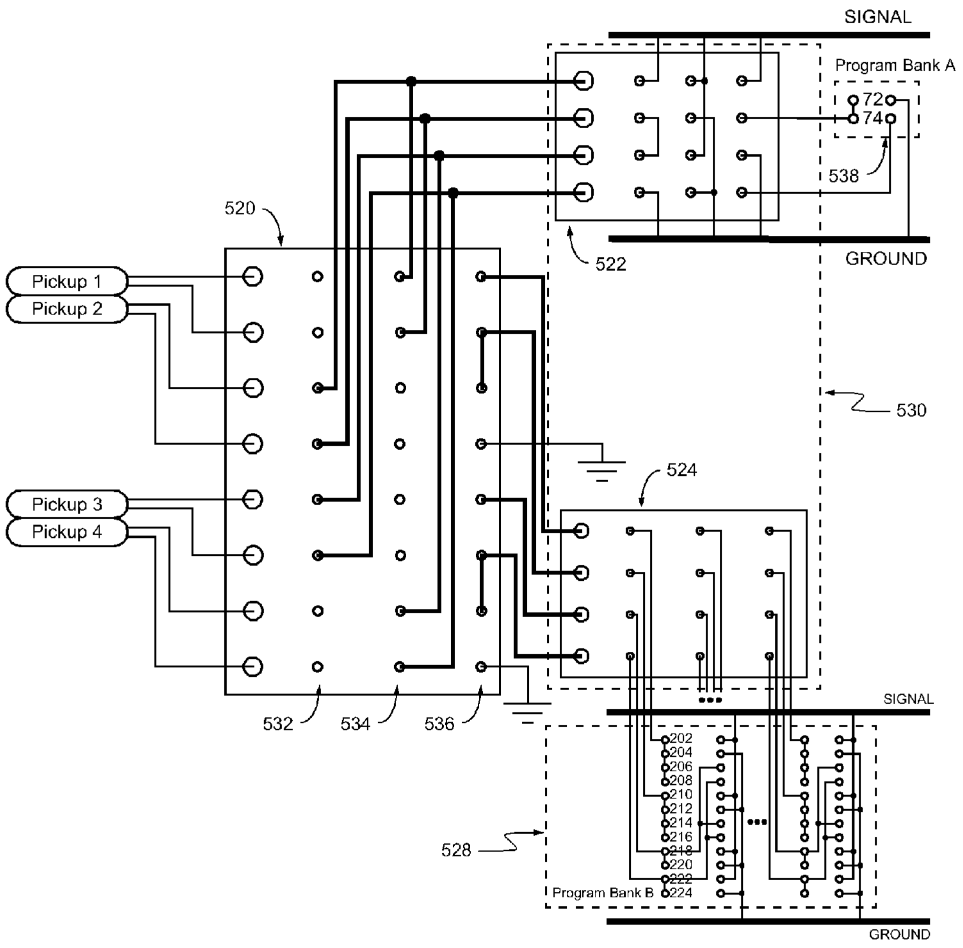
FIG. 17 shows another multi-switch embodiment.

As FIGS. 16 and 17 show, the dual-switch embodiment of FIGS. 8, 9, 10, and 11 is also not a limitation of the invention. FIG. 16 shows a multi-switch embodiment that extends the embodiment of FIG. 13, effectively doubling the capacity of the switch in FIG. 13 by combining multiple switches together. The first switch 500 is a 4P2T switch that selects between two other switches 502 504, which are drawn as independent 4P5T switches for purposes of illustration but could be implemented as a single 8P5T switch 510. The resulting design is effectively two of the FIG. 13 embodiment, doubling the number of pickup topologies available to a musician at performance time, from five to ten, all of which are programmable via Program Banks A 506 and B 508.

FIG. 17 shows a multi-switch embodiment that demonstrates the second switches 522 524 in such an embodiment need not be homogeneous in their function or design. The first switch 520 is an 8P3T switch, the first two settings of which 532 534 behave like the element selection switch of FIG. 8. Setting 1 532 connects the positive and negative leads of Pickups 2 and 3 to 4P3T switch 522; setting 2 534 connects the positive and negative leads of Pickups 1 and 4 to switch 522. Switch 522 functions as a topology selection switch and puts the input pickups into a selected topology such as series, parallel, and phase combinations similarly to switch 50 in FIG. 10. The last setting of switch 520 connects the pickups, using a wiring similar to the input of the switch in FIG. 13, to 4P3T switch 524, which then behaves similarly to the FIG. 13 embodiment, though with fewer switch settings. Though switches 522 and 524 are drawn as independent 4P3T switches for purposes of illustration, they could be implemented as a single 8P3T switch 530. At performance time, nine different pickup topologies are available to a musician. Three of the nine are fully programmable, via switch 524 and Program Bank B 528, when switch 520 is placed in setting 3 536; the other six are series/parallel/phase topologies (as dictated by the state of switch 522 and Program Bank A 538) of the two-pickup combinations selected by settings 1 532 and 2 534 of switch 520.

The disclosed embodiments of the programmable switch of the present invention allow signal processing designers to generate different circuit topologies dynamically and guitarists to select from the full range of series/parallel/phase pickup topologies available in a particular guitar. The programmable switch of the present invention is not limited to the detailed description of the software and hardware embodiments disclosed herein. Obvious modifications and alterations to the embodiments will occur when reading and understanding the specification. The programmable switch is intended to include all such modifications and alterations within the scope of the appended claims or the equivalence thereof.

The invention claimed is:

1. A programmable switch for configuring user selected combinations of pickup coils in user selected pickup topology configurations in electronic musical instruments, comprising:

A) a passive, asynchronous, m-throw switch having m-switch settings;

B) a passive, asynchronous, programmable switch-setting program;

C) a superset of all possible program settings available in the single programmable switch,
each setting of the programmable switch is programmable by any setting in the superset,
the superset being every possible combination of pickups, in every possible topology;
D) a user selected subset of the superset of pickup and topology switch settings;
E) the programmable switch programmed with the user subset of pickup and topology switch settings;
F) only the m-throw switch is manipulated while the electronic instrument is played; and
G) after the electronic instrument is played, the programmable switch can be reprogrammed with a new subset of coils and pickup topologies from the superset of all possible program settings.

2. The programmable switch of claim 1 wherein at least one component is active.

3. The programmable switch of claim 1 wherein the switch is implemented in a hardware description language.

4. The programmable switch of claim 1 wherein the switch is implemented in programmable logic.

5. The programmable switch of claim 1 wherein programmable switch-setting program is implemented in a program bank of dual-in-line switches.

6. The programmable switch of claim 1 wherein programmable switch-setting program is implemented in a program bank of jumpers.

7. A two-stage pickup topology switch comprising:
A) two switches,
a passive, asynchronous pickup selection switch, and
a passive, asynchronous topology selection switch;
B) pickup coil leads connect to the pickup selection switch;
C) the pickup selection switch is connected to the topology selection switch;
D) a user chosen subset of pickup coils connects, through the pickup selection switch, to the topology selection switch;
E) the topology selection switch combines the user chosen subset of pickup coils into user chosen topology combinations of the selected coils;
F) the two switches together provide every possible combination of the user chosen subset of pickup coils in every possible circuit configuration; and
G) with two switches a musician can obtain any possible combination of coils and pickup topologies from the user chosen subset of pickup coils.

8. The two-stage pickup topology switch of claim 7 wherein the pickup-selection switch is programmable, comprising:
A) a passive, asynchronous, programmable switch-setting program;
B) a superset of all possible pickup settings available in the programmable pickup selection switch,
each setting of the programmable pickup selection switch is programmable by any setting in the superset,
the superset being every possible combination of pickups;
C) a user selected subset of the superset of pickup settings;
D) the programmable pickup selection switch is programmed with the user subset of pickup switch settings;
E) only the pickup selection switch and the topology selection switch are manipulated while the electronic instrument is played; and
F) after the electronic instrument is played, the programmable pickup selection switch can be reprogrammed with a new subset from the superset of all possible pickup settings.

9. The two-stage pickup topology switch of claim 7 wherein the topology-selection switch is programmable, comprising:
A) a passive, asynchronous, programmable topology setting program;
B) a superset of all possible topology settings available in the programmable switch,
each setting of the programmable switch is programmable by any setting in the superset,
the superset being every possible combination of pickups, in every possible topology;
C) a user selected subset of the superset of pickup switch settings;
D) the programmable topology switch programmed with the user subset of topology switch settings;
E) only the pickup selection and the topology switch are manipulated while the electronic instrument is played; and
F) after the electronic instrument is played, the programmable switch can be reprogrammed with a new subset of pickup topologies from the superset of all possible topology settings.

10. The two-stage pickup topology switch of claim 7 wherein the pickup selection switch and the topology-selection switch are programmable, comprising:
A) a programmable pickup-selection switch setting program;
B) a programmable topology-selection switch setting program;
C) every switch of the topology-selection switch is configurable to any combination of pickup coils, received from the pickup selection switch, in any pickup topology configuration;
D) all user selected pickup-selection switch settings and topology switch settings are programmed prior to usage of the electronic musical instrument;
E) the programmable pickup-selection switch setting program configures the pickup-selection switch;
F) the topology-selection switch program configures the topology-selection switch;
G) during usage of electronic musical instrument a musician manipulates the pickup-selection switch to obtain the user programmed pickup combination and the topology selection switch for the topology selection set.

11. The programmable switch of claim 10 wherein at least one component is active.

12. The programmable switch of claim 10 wherein the switch is implemented in a hardware description language.

13. The programmable switch of claim 12 wherein programmable switch-setting program is implemented in a program bank of jumpers.

14. The programmable switch of claim 10 wherein the switch is implemented in programmable logic.

15. The programmable switch of claim 10 wherein programmable switch-setting program is implemented in a program bank of dual-in-line switches.

16. The programmable switch of claim 10 wherein programmable switch-setting program is implemented in a program bank of jumpers.

17. A pickup topology selection switch, having
a single, passive, asynchronous switch;
at least two pickup leads connected to the switch;

the switch providing every possible circuit combination of the pickups connected to it, the pickups in series in phase, in series out of phase, parallel in phase, and parallel out of phase.

18. The programmable switch of claim 17 wherein at least one component is active.

19. The programmable switch of claim 17 wherein the switch is implemented in a hardware description language.

20. The programmable switch of claim 1 wherein the switch is implemented in programmable logic.

21. The programmable switch of claim 17 wherein programmable switch-setting program is implemented in a program bank of dual-in-line switches.

* * * * *